(12) United States Patent
Shi

(10) Patent No.: US 9,232,671 B2
(45) Date of Patent: Jan. 5, 2016

(54) STAND STRUCTURE AND PORTABLE ELECTRONIC DEVICE WITH STAND

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Zhi-Jun Shi, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 382 days.

(21) Appl. No.: 13/727,485

(22) Filed: Dec. 26, 2012

(65) Prior Publication Data

US 2013/0163164 A1 Jun. 27, 2013

(30) Foreign Application Priority Data

Dec. 27, 2011 (CN) .......................... 2011 1 0443300

(51) Int. Cl.
H05K 5/02 (2006.01)
H05K 5/03 (2006.01)
G06F 1/16 (2006.01)

(52) U.S. Cl.
CPC ....... *H05K 5/03* (2013.01); *G06F 1/166* (2013.01); *H05K 5/0217* (2013.01); *H05K 5/0234* (2013.01)

(58) Field of Classification Search
CPC ....... H05K 5/03; H05K 5/0234; H05K 5/0217; G06F 1/166
USPC ................................. 248/677, 676, 688, 474
See application file for complete search history.

(56) References Cited

U.S. PATENT DOCUMENTS

| | | | | |
|---|---|---|---|---|
| 5,516,064 A * | 5/1996 | Hsieh | .............. | 248/96 |
| 6,282,084 B1 * | 8/2001 | Goerdt et al. | ............ | 361/679.55 |
| 6,975,507 B2 * | 12/2005 | Wang et al. | .............. | 361/679.21 |
| 7,036,787 B1 * | 5/2006 | Lin | ............... | 248/676 |
| 7,301,759 B2 * | 11/2007 | Hsiung | .................... | 361/679.27 |
| 2004/0084588 A1 * | 5/2004 | Liu et al. | ..................... | 248/291.1 |
| 2005/0082459 A1 * | 4/2005 | Liu et al. | ........................ | 248/676 |
| 2005/0121594 A1 * | 6/2005 | Kuo | ................. | 248/676 |
| 2005/0263660 A1 * | 12/2005 | Hsiung | ..................... | 248/291.1 |
| 2010/0072334 A1 * | 3/2010 | Le Gette et al. | ........... | 248/176.3 |
| 2011/0260014 A1 * | 10/2011 | Chen | ............................. | 248/157 |
| 2013/0134284 A1 * | 5/2013 | Hu et al. | ....................... | 248/451 |
| 2013/0175423 A1 * | 7/2013 | Coberly | ........................ | 248/558 |

* cited by examiner

*Primary Examiner* — David M Sinclair
*Assistant Examiner* — Robert Brown
(74) *Attorney, Agent, or Firm* — Novak Druce Connolly Bove + Quigg LLP

(57) ABSTRACT

An exemplary stand structure includes a base board, telescopic supporting rods, and a holding base. The supporting rods are retractable into the base board with the holding base detachably engaged on the base board. When the base board needs to be supported in a slanting orientation, the holding base is detached from the base board, the supporting rods depart from the base board, and the supporting rods are extended to lengths and locations at which the holding base is in a desired position to support the base board.

19 Claims, 9 Drawing Sheets

STAND STRUCTURE AND PORTABLE ELECTRONIC DEVICE WITH STAND

BACKGROUND

1. Technical Field

The present disclosure relates to stands for supporting objects such as electronic devices, and particularly to a stand that is usable in an electronic device enclosure, for example.

2. Description of Related Art

Generally, handheld electronic devices do not have a stand for supporting the electronic device. A user has to hold the electronic device in a certain desired orientation. However, to hold the electronic device for a long time can be uncomfortable.

Therefore, it is desirable to provide a means which can overcome the above-mentioned problems.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
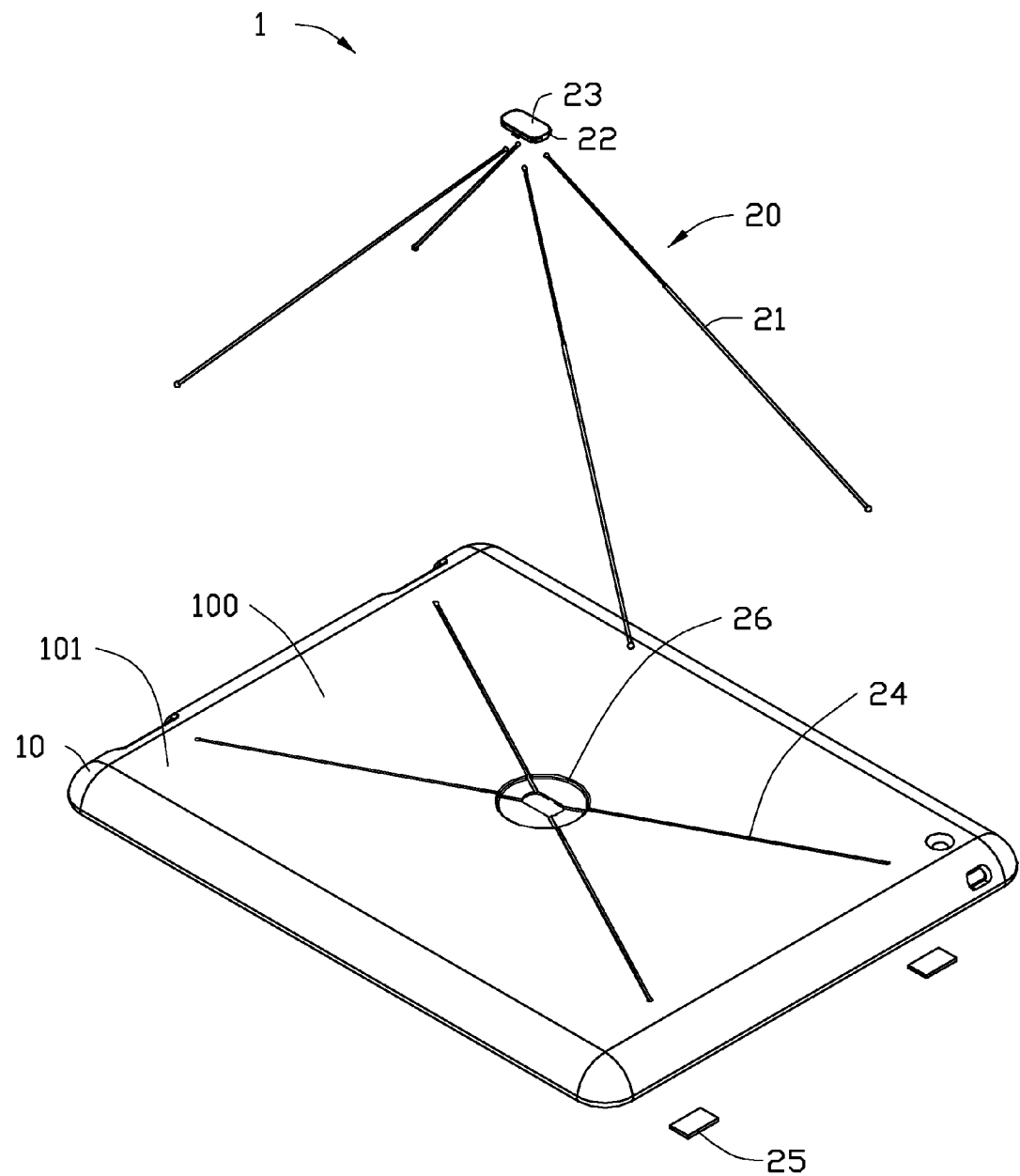
FIG. 1 is an exploded, isometric view of a stand structure for supporting an electronic device in accordance with an exemplary embodiment, wherein the stand structure includes four supporting rods, a holding base, a cover, and a base board of an enclosure of the electronic device, showing the enclosure in a face down position.

FIG. 1 illustrates an enclosure 10 and a stand 20 of an electronic device 1, in accordance with a first embodiment. The electronic device 1 may, for example, be a portable electronic device such as a handheld device. The stand 20 is set on the enclosure 10. The enclosure 10 includes a rear base board 100. The base board 100 includes an inner sidewall 102 and an outer sidewall 101 (see also FIGS. 7-8). The inner sidewall 102 is parallel to the outer sidewall 101. The stand 20 includes at least one telescopic supporting rod 21, a holding base 22, a cover 23, and at least one fastening board 25. The enclosure 10 defines at least one stowing groove 24 in the base board 100 for receiving the at least one supporting rod 21. In the illustrated embodiment, there are four supporting rods 21, four fastening boards 25 and four stowing grooves 24. The enclosure 10 further defines a receiving recess 26 in a center of the base board 100, for receiving the holding base 22.

Figure 2:
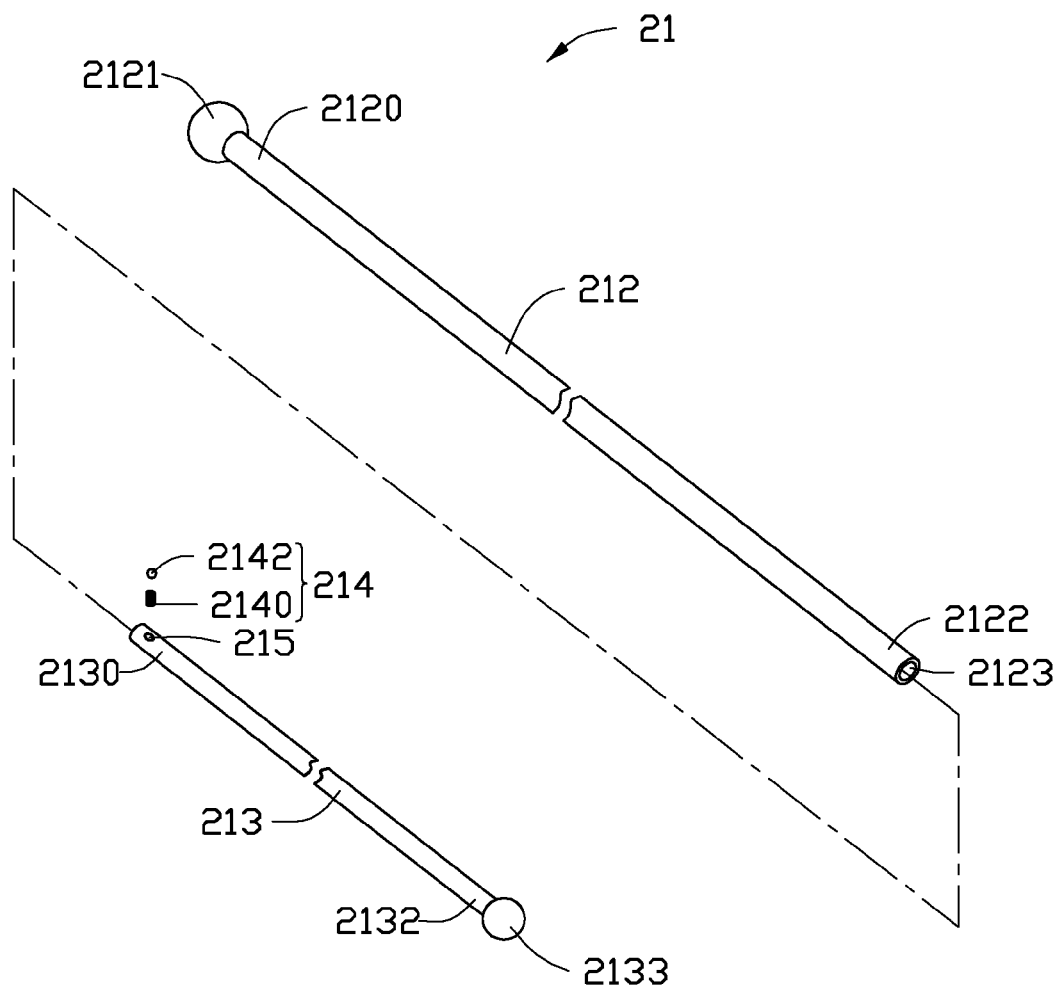
FIG. 2 is an enlarged, exploded, abbreviated, isometric view of one of the supporting rods of FIG. 1.
Figure 3:
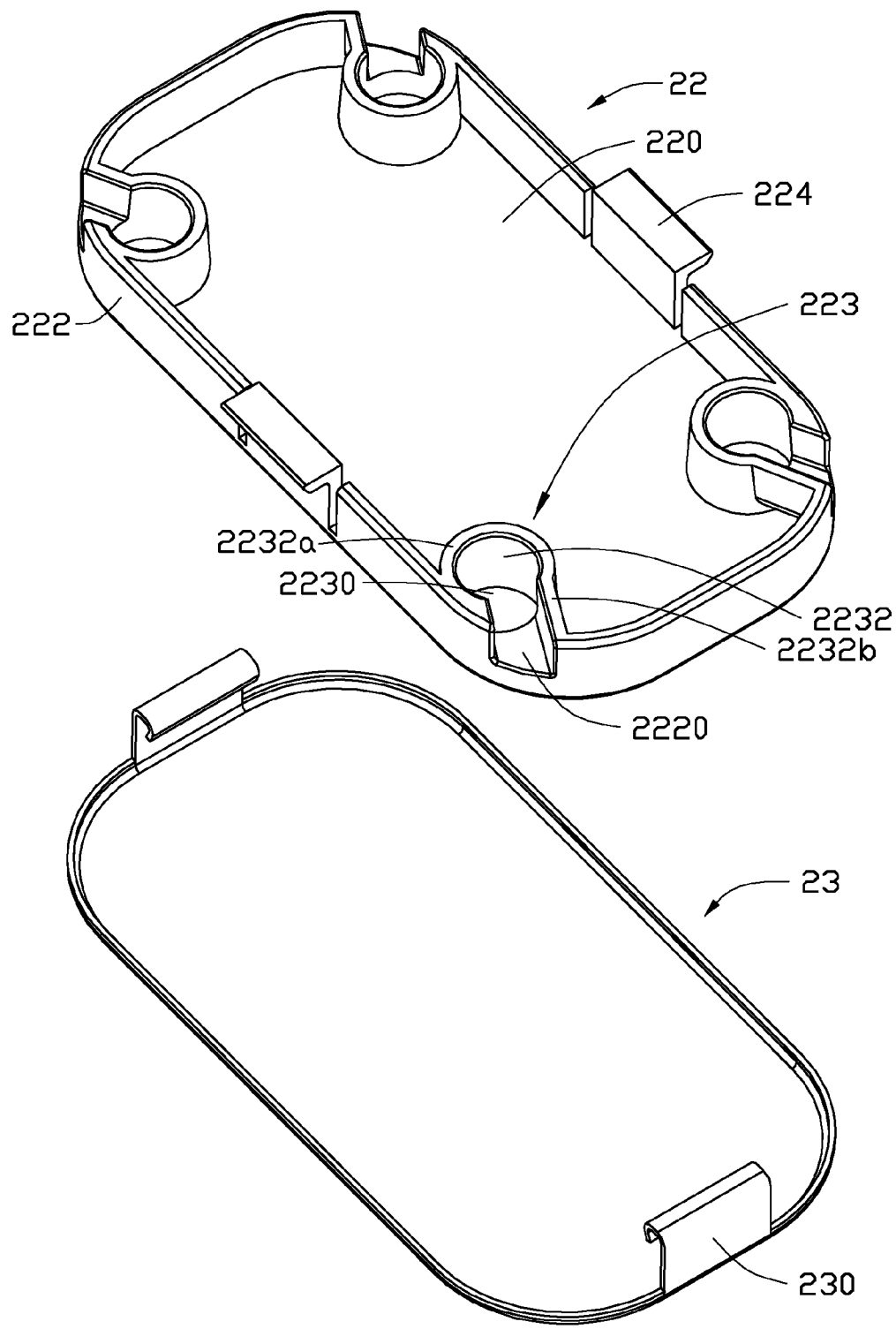
FIG. 3 is an enlarged, exploded, isometric view of the holding base and the cover of FIG. 1.
Figure 5:
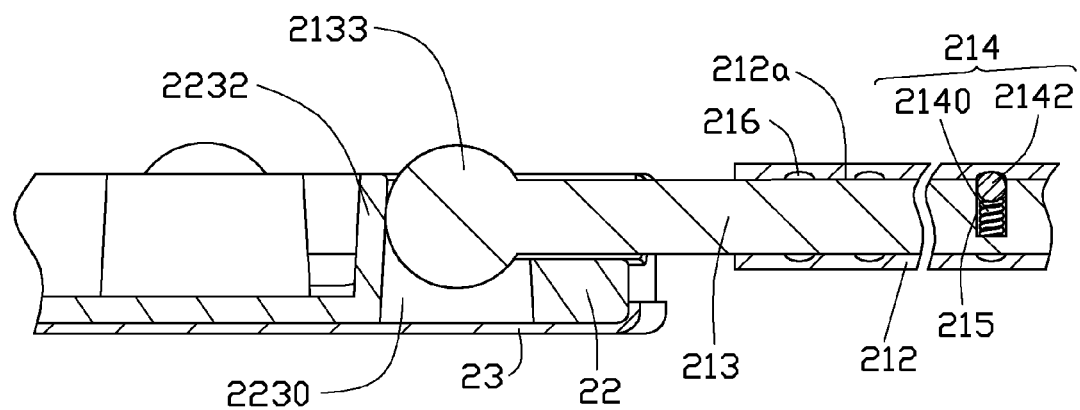
FIG. 5 is an abbreviated, cross-sectional view of part of the holding base and one of the supporting rods of FIG. 4, corresponding to line V-V thereof.

FIGS. 2 and 5 show that each supporting rod 21 includes a first connecting part 212, a second connecting part 213 sleeved in the first connecting part 212, and a positioning mechanism 214 set in the second connecting part 213. The first connecting part 212 is substantially an elongated hollow post. The second connecting part 213 is substantially an elongated post. The second connecting part 213 can be hollow or solid. An inner diameter of the first connecting part 212 is slightly greater than an outer diameter of the second connecting part 213. Thus, the second connecting part 213 can insert into and slide along the first connecting part 212, and the second connecting part 213 is retractable into and extendable from the first connecting part 212.

Figure 8:
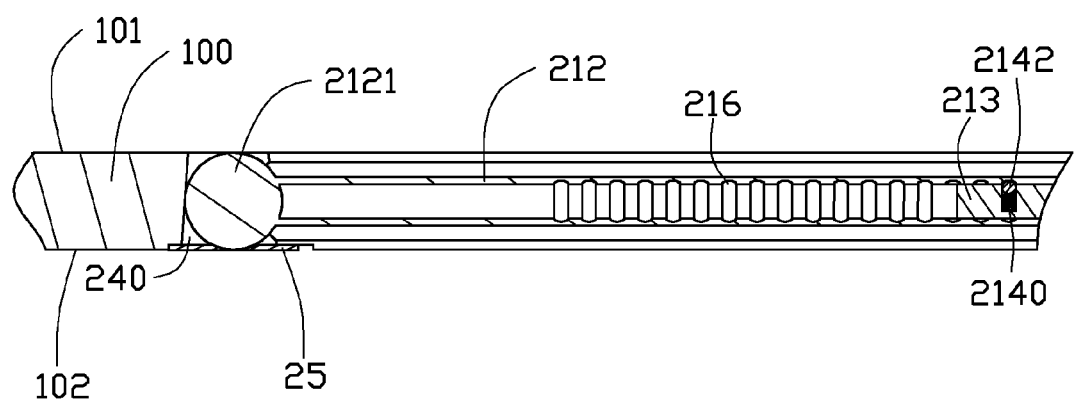
FIG. 8 is a cross-sectional view taken along line VIII-VIII of FIG. 6.

The first connecting part 212 includes a first connecting end 2120 and an opposite second connecting end 2122. The second connecting part 213 includes a third connecting end 2130 and an opposite fourth connecting end 2132. The first connecting part 212 defines an opening 2123 at the second connecting end 2122. The third connecting end 2130 inserts into the first connecting part 212 via the opening 2123, and is slidably received in the first connecting part 212. The second connecting part 213 defines a positioning hole 215 close to the third connecting end 2130, for receiving the positioning mechanism 214. The first connecting part 212 defines a number of annular positioning grooves 216 in an inner surface 212a thereof, as shown in FIGS. 5 and 8. The positioning mechanism 214 engages in one of the positioning grooves 216 to position a selected portion of the second connecting part 213 within the first connecting part 212.

In this embodiment, the positioning mechanism 214 includes a spring 2140 and a ball 2142. One end of the spring 2140 connects with the ball 2142. The other end of the spring 2140 is fastened in the positioning hole 215. The spring 2140 holds the ball 2142 such that a distal part of the ball 2142 is exposed out of a top opening of the positioning hole 215. When the ball 2142 is pressed inward, the spring 2140 compresses. That is, the ball 2142 can resiliently move in and out along a same radius of the second connecting part 213. When the positioning mechanism 214 is aligned with any of the positioning grooves 216, the ball 2142 resiliently inserts into the positioning groove 216 to thereby position the second connecting part 213 in the first connecting part 212. When the position of the second connecting part 213 in the first connecting part 212 needs to be changed, the second connecting part 213 is pushed or pulled along the longitudinal direction of the first connecting part 212, and the ball 2142 escapes from the positioning groove 216 and slides along the inner surface 212a of the first connecting part 212 until the ball 2142 inserts into another desired positioning groove 216.

Figure 4:
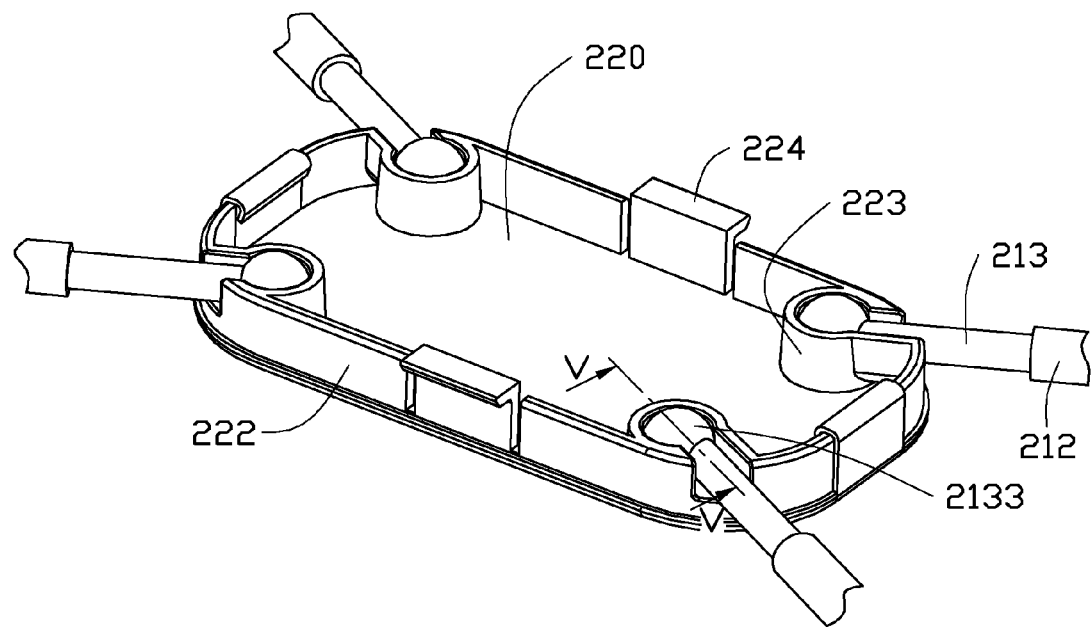
FIG. 4 is an enlarged, isometric view of the holding base and connecting end portions of the supporting rods of FIG. 1 connected together.

FIGS. 2 and 4-5 show that the second connecting part 213 forms a first spherical joint 2133 at the fourth connecting end 2132. In this embodiment, the holding base 22 is approximately rectangular with four rounded corners, and includes a top board 220, a peripheral sidewall 222, and a number of sockets 223. In the illustrated embodiment, there are four sockets 223 at the four corners of the holding base 22. The sidewall 222 perpendicularly extends down from a periphery of the top board 220. The holding base 22 forms a number of connecting hooks 224 on the sidewall 222. Each of the sockets 223 includes a positioning wall 2232 and defines a first draw hole 2230. The positioning wall 2232 extends down along a direction away from the top board 220, and forms a peripheral wall of the first draw hole 2230. The positioning wall 2232 includes a restricting part 2232a and a guiding part 2232b. The restricting part 2232a is substantially in the form of a truncated cone. An inner diameter of the restricting part 2232a gradually reduces from an end thereof at the cover 23 to an end thereof far from the cover 23. The guiding part 2232b extends from a lower portion of the restricting part 2232a to the sidewall 222 to define a channel 2220 communicating the first draw hole 2230 with the lateral exterior of the holding base 22.

In this embodiment, the top board 220 is substantially a rectangular plate with four rounded corners. The first draw holes 2230 are correspondingly defined in the four corners. The guiding parts 2232b of the four positioning walls 2232 extend along two diagonal lines of the top board 220, with the diagonal lines crossing at a geometrical center of the top board 220. The diameter of the first draw hole 2230 is similar to the diameter of the first spherical joint 2133. The inner diameter of the narrowest (lowest) end of the restricting part 2232a is less than the diameter of the first spherical joint 2133, and the inner diameter of the widest (highest) end of the restricting part 2232a is slightly greater than the diameter of the first spherical joint 2133. The second connecting part 213 extends out of the holding base 22 via the channel 2220, with the first spherical joint 2133 rotatably received and held in the restricting part 2232a.

The cover 23 fastens on the holding base 22 for shielding the first draw holes 2230 of the holding base 22. The cover 23 has a shape similar to that of the top board 220. In this embodiment, the cover 23 is a rectangular plate with four rounded corners. Two opposite ends of the cover 23 have a pair of downwardly extending fastening hooks 230, respectively. The fastening hooks 230 correspondingly connect with a periphery of the sidewall 222 to fasten the cover 23 onto the top board 220.

Figure 6:
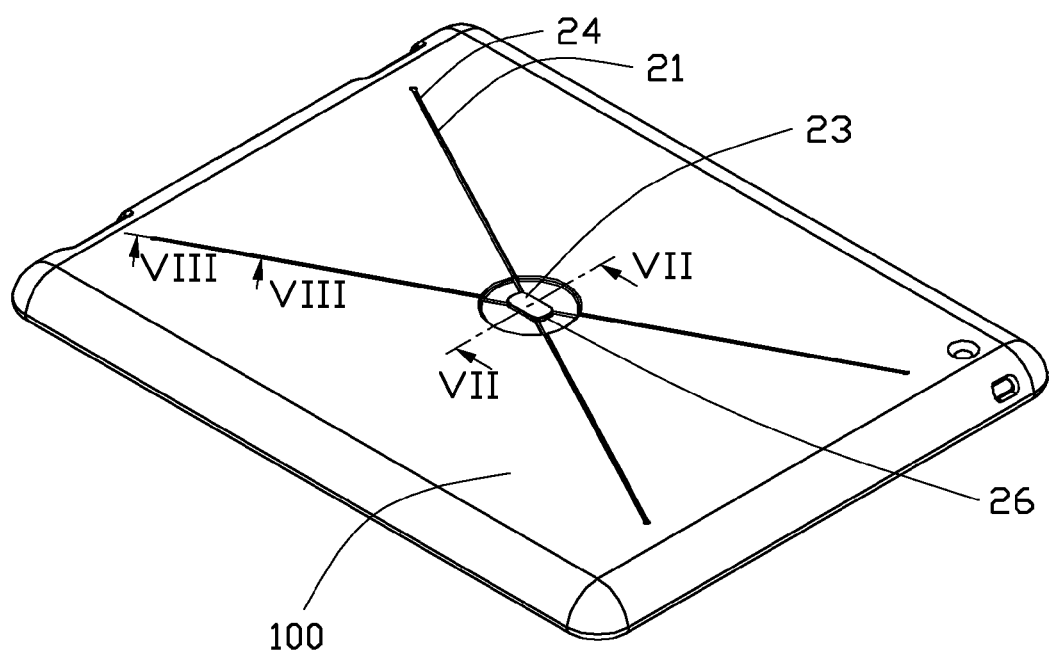
FIG. 6 is an assembled view of the stand structure and enclosure of FIG. 1, showing the supporting rods, the holding base and the cover stowed in the base board of the enclosure.
Figure 7:
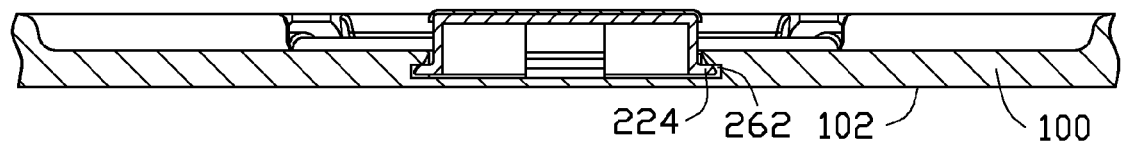
FIG. 7 is a cross-sectional view taken along line VII-VII of FIG. 6.

FIGS. 1 and 6-7 show that the receiving recess 26 is defined in a center of the base board 100. The receiving recess 26 has a shape and size similar to those of the top board 220. The holding base 22 is fastened in the receiving recess 26 by the connecting hooks 224 inserting into a pair of fastening grooves 262 defined in an inner sidewall of the receiving recess 26, as shown in FIG. 7.

FIGS. 2 and 8 show that the first connecting part 212 of each supporting rod 21 forms a second spherical joint 2121 at the first connecting end 2120. The stowing grooves 24 extend from the receiving recess 26 along two diagonal lines of the base board 100, with the diagonal lines crossing at a geometrical center of the base board 100. The directions in which the stowing grooves 24 extend correspond to the directions in which the guiding parts 2232b of the holding base 22 extend. The base board 100 defines four second draw holes 240 at ends of the stowing grooves 24 away from the receiving recess 26, respectively. The structure of each second draw hole 240 is essentially the same as the structure of each first draw hole 2230. The second spherical joint 2121 of each supporting rod 21 is rotatably received and held in a corresponding one of the second draw holes 240. The fastening boards 25 cover bottom openings of the second draw holes 240, respectively, to prevent the second spherical joints 2121 from escaping out of the second draw holes 240.

In assembly of the stand 20 and the enclosure 10, the second spherical joints 2121 of the first connecting parts 212 are movably connected into the second draw holes 240. The second connecting parts 213 are passed through the first draw holes 2230, and the first spherical joints 2133 of the second connecting parts 213 are movably connected into the first draw holes 2230. The third connecting end 2130 of each second connecting part 213 is slidably sleeved into the corresponding first connecting part 212 via the opening 2123 at the second connecting end 2122 of the first connecting part 212. The positioning mechanism 214 is engaged in any one of the positioning grooves 216 for positioning the second connecting part 213 in the first connecting part 212. The length of the supporting rod 21 can be adjusted by pushing or pulling the second connecting part 213 relative to the first connecting part 212. In this embodiment, the assembled stand 20 and enclosure 10 includes the four stowing grooves 24 correspondingly extending from the four corners of the rectangular receiving recess 26 along the diagonal lines of the base board 100, and the four second connecting parts 213 correspondingly sleeved in the four first connecting parts 212 to form the four supporting rods 21. The supporting rods 21 are retractable into and extendable out from the stowing grooves 24.

When the electronic device 1 is not in use, the holding base 22 is fastened on the base board 100 by the connecting hooks 224 being engaged in the fastening grooves 262. The supporting rods 21 are correspondingly fully received in the stowing grooves 24.

Figure 9:
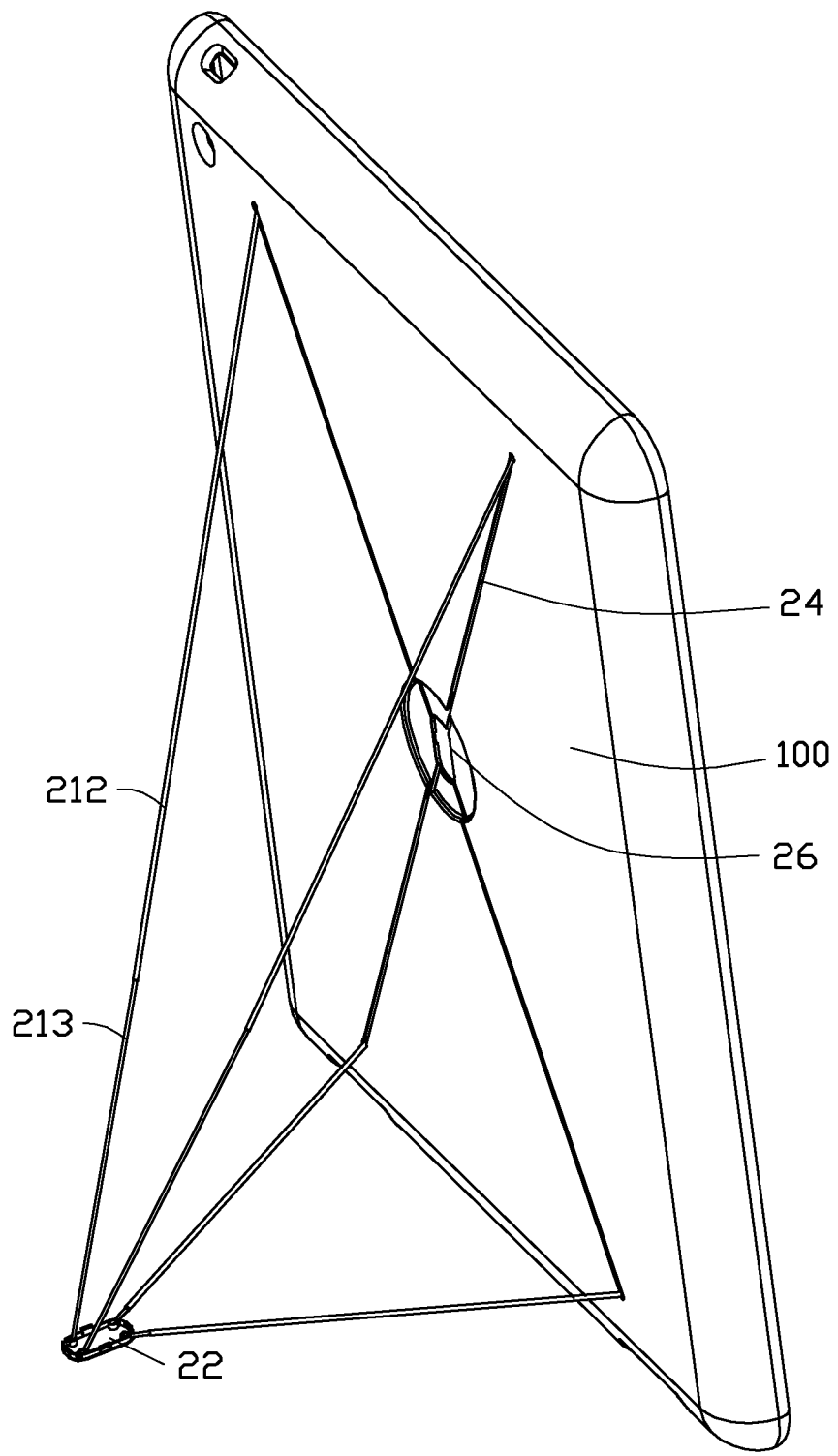
FIG. 9 is an assembled, isometric view of the stand structure and enclosure of FIG. 1, showing the stand structure supporting the enclosure.

FIG. 9 shows that when the electronic device 1 needs to be supported by the stand 20, the holding base 22 is pulled out of the receiving recess 26. The length of each supporting rod 21 can be adjusted, to achieve any one of different desired viewing angles for the electronic device 1. That is, in a typical application, the cover 23 and one side of the enclosure 10 rest on a supporting surface (not shown) and cooperatively hold the electronic device 1 in position.

In a second embodiment, the stand 20 is formed on a base board of a protection case of the electronic device 1. The stand 20 can support the protection case, thereby supporting the electronic device 1 received in the protection case.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A stand structure comprising:
   a base board;
   four telescopic supporting rods, an end of each of the four telescopic supporting rods rotatably connected to the base board; and
   a holding base, the other end of each of the four telescopic supporting rods opposite to the end connected to the base board rotatably connected to the holding base;
   wherein the four telescopic supporting rods are retractable into the base board with the holding base detachably engaged on the base board; and
   when the base board needs to be supported in a slanting orientation, the holding base is detached from the base board, the other end of each of the four telescopic supporting rods departs from the base board, and the four telescopic supporting rods are extended to a length and location at which the holding base is in a desired position.

2. The stand structure of claim 1, wherein each of the four supporting rods comprises a first connecting part and a second connecting part, and the second connecting part is slidably sleeved in the first connecting part.

3. A stand structure comprising:
a base board;
at least one telescopic supporting rod, an end of the at least one supporting rod rotatably connected to the base board, wherein the at least one supporting rod comprises a first connecting part and a second connecting part, and the second connecting part is slidably sleeved in the first connecting part; and
a holding base, the other end of the at least one supporting rod opposite to the end connected to the base board rotatably connected to the holding base;
wherein the at least one supporting rod is retractable into the base board with the holding base detachably engaged on the base board; and
when the base board needs to be supported in a slanting orientation, the holding base is detached from the base board, the other end of the at least one supporting rod departs from the base board, and the at least one supporting rod is extended to a length and location at which the holding base is in a desired position;
wherein the at least one supporting rod further comprises a resilient positioning mechanism set in the second connecting part, the first connecting part defines a plurality of positioning grooves in an inner surface thereof, with the positioning grooves arranged one after another along a length of the first connecting part, and the positioning mechanism detachably engages in any one of the positioning grooves to position a selected portion of the second connecting part within the first connecting part.

4. The stand structure of claim 3, wherein the positioning mechanism comprises a spring and a ball, the spring resilient moves along a radial direction of the second connecting part, one end of the spring is connected to the second connecting part, the other end of the spring is connected to the ball, and the ball is detachably engaged in any one of the positioning grooves.

5. The stand structure of claim 3, wherein the base board defines a receiving recess and at least one stowing groove extending from the receiving recess; and when the holding base is detachably engaged on the base board, the holding base is received in the receiving recess, and the at least one supporting rod is received in the at least one stowing groove.

6. The stand structure of claim 5, wherein the holding base comprises a top board, a peripheral sidewall, and at least one socket, the sidewall perpendicularly extends from a periphery of the top board, the end of the at least one supporting rod is rotatably connected to the at least one socket.

7. The stand structure of claim 6, wherein the at least one socket comprises a positioning wall extending down from the top board, and a tapered first draw hole, and the first draw hole is defined in both the top board and the positioning wall, with the positioning wall forming a peripheral wall of the first draw hole.

8. The stand structure of claim 7, wherein the positioning wall comprises a guiding part and a restricting part, the restricting part is substantially a truncated cone, an inner diameter of the restricting part gradually reduces from an end thereof at the cover to an end thereof far from the cover, the guiding part extends from a lower portion of the restricting part to the sidewall, and the guiding part defines therein a channel communicating the first draw hole with a lateral exterior of the holding base.

9. The stand structure of claim 8, wherein the second connecting part forms a first spherical joint at the end thereof connecting with the at least one socket, the inner diameter of the narrowest end of the restricting part is less than the diameter of the first spherical joint, the inner diameter of the widest end of the restricting part is slightly greater than the diameter of the first spherical joint, and the first spherical joint is rotatably received and held in the restricting part.

10. The stand structure of claim 9, wherein the first connecting part forms a second spherical joint at the end thereof connecting with the at least one stowing groove, the base board defines a tapered second draw hole at an end of the at least one stowing groove far from the receiving recess, and the second spherical joint is rotatably received and held in the second draw hole.

11. The stand structure of claim 6, wherein the holding base forms a plurality of connecting hooks on the sidewall, and the holding base is detachably fastened in the receiving recess by the connecting hooks inserting into a pair of fastening grooves defined in an inner sidewall of the receiving recess.

12. The stand structure of claim 6, further comprising a cover having a shape corresponding to that of the top board, wherein the cover has a pair of downwardly extending fastening hooks at two opposite ends thereof, and the fastening hooks correspondingly connect with a periphery of the sidewall to fasten the cover onto the top board.

13. The stand structure of claim 3, wherein the base board is a part of an enclosure of an electronic device.

14. The stand structure of claim 3, wherein the base board is a part of a protection case of an electronic device.

15. A portable electronic device comprising:
an enclosure comprising a base board;
at least one telescopic supporting rod, an end of the at least one supporting rod rotatably connected to the base board; and
a holding base, the other end of the at least one supporting rod opposite to the end connected to the base board rotatably connected to the holding base;
wherein the at least one supporting rod is retractable into the base board with the holding base detachably engaged on the base board; and
when the enclosure needs to be supported on one side edge thereof, the holding base is detached from the base board, the other end of the at least one supporting rod departs from the base board, and the at least one supporting rod is extended to a length and location at which the holding base is in a desired position;
wherein the at least one supporting rod comprises a first connecting part, a second connecting part, and a positioning mechanism set in the second connecting part, the second connecting part is slidably sleeved in the first connecting part, the first connecting part defines a plurality of positioning grooves in an inner surface of the first connecting part, the positioning mechanism engages in the positioning groove to position a selected portion of the second connecting part within the first connecting part.

16. The portable electronic device of claim 15, wherein the base board defines a receiving recess and at least one stowing groove extending from the receiving recess, the holding base is received in the receiving recess, and the at least one supporting rod is received in the at least one stowing groove.

17. The portable electronic device of claim 16, wherein the holding base comprises a top board, a peripheral sidewall, and at least one socket, the sidewall perpendicularly extends from a periphery of the top board, the end of the at least one supporting rod is rotatably connected to the at least one socket.

18. The portable electronic device of claim 17, wherein the at least one socket comprises a positioning wall and defines a first draw hole in the top board, the positioning wall extends down along a direction away from the top board, and forms a peripheral wall of the first draw hole.

19. The portable electronic device of claim 18, wherein the positioning wall comprises a guiding part and a restricting part, the restricting part is substantially inverted cone, an inner diameter of the restricting part gradually reduces from an end thereof at the cover to an end thereof far from the cover, the guiding part extends from a lower portion of the restricting part to the sidewall to defines a channel communicating the first draw hole with the lateral exterior of the holding base, the second connecting part forms a first spherical joint at the end of the second connecting part connecting with the at least one socket, the first spherical joint is rotatably connected to the restricting part, the first connecting part forms a second spherical joint at the end of the first connecting part connecting with the at least one stowing groove, the second spherical joint is rotatably connected to a second draw hole having a shape similar to that of the first draw hole and being defined at an end of the each stowing groove far from the receiving recess.

* * * * *